United States Patent
Shi

(10) Patent No.: US 10,482,826 B2
(45) Date of Patent: Nov. 19, 2019

(54) GOA DRIVING CIRCUITS AND DISPLAY DEVICES

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd, Shenzhen, Guangdon (CN)

( * ) Notice: Subject to any disclaimer, the term of this patent is extended or adjusted under 35 U.S.C. 154(b) by 434 days.

(21) Appl. No.: 15/328,478

(22) PCT Filed: Jan. 12, 2017

(86) PCT No.: PCT/CN2017/071002
§ 371 (c)(1),
(2) Date: Jan. 23, 2017

(87) PCT Pub. No.: WO2018/120297
PCT Pub. Date: Jul. 5, 2018

(65) Prior Publication Data
US 2018/0336831 A1    Nov. 22, 2018

(30) Foreign Application Priority Data

Dec. 30, 2016    (CN) .......................... 2016 1 1259806

(51) Int. Cl.
G09G 3/34    (2006.01)
G09G 3/20    (2006.01)
H01L 33/00    (2010.01)

(52) U.S. Cl.
CPC ............... *G09G 3/34* (2013.01); *H01L 33/00* (2013.01)

(58) Field of Classification Search
None
See application file for complete search history.

(56) References Cited

U.S. PATENT DOCUMENTS 8,605,027 B2 * 12/2013 Pak ...................... G09G 3/3677
                                                    315/169.2
9,135,878 B2 *  9/2015 Kim ..................... G09G 3/3677
(Continued)

FOREIGN PATENT DOCUMENTS

CN    104299589 A    1/2015
CN    104505049 A    4/2015
(Continued)

*Primary Examiner* — Minh D A
*Assistant Examiner* — James H Cho
(74) *Attorney, Agent, or Firm* — Andrew C. Cheng

(57) ABSTRACT

The present disclosure relates to a GOA driving circuit including N number of cascaded GOA units, wherein N is a natural number not smaller than four. The GOA unit at the i-th level includes a first controllable transistor (T1), a second controllable transistor (T2), a third controllable transistor (T3), a first capacitor (C1), and a first pull-down maintain unit, wherein $1 \le i \le a$ and "a" is a natural number smaller than or equal to N/2. The GOA unit at the j-th level includes a fourth controllable transistor (T4), a fifth controllable transistor (T5), a second capacitor (C2), and a second pull-down maintain unit 20, wherein $a+1 \le j \le N$. The GOA driving circuit may reduce the line buffer so as to reduce the cost of the GOA driving circuit.

14 Claims, 4 Drawing Sheets

(56) References Cited

U.S. PATENT DOCUMENTS

| 9,536,466 B2* | 1/2017 | Nie | G09G 3/2096 |
| 2016/0260398 A1* | 9/2016 | Yao | G09G 3/3648 |

FOREIGN PATENT DOCUMENTS

| CN | 105590612 A | 5/2016 |
| CN | 106057118 A | 10/2016 |
| KR | 20140019920 A | 2/2014 |

* cited by examiner

GOA DRIVING CIRCUITS AND DISPLAY DEVICES

BACKGROUND OF THE INVENTION

1. Field of the Invention

The present disclosure relates to display technology, and more particularly to a gate driver on array (GOA) driving circuit and a display device.

2. Discussion of the Related Art

GOA technology relates to the technology in which a gate driver IC is directly formed on an array substrate. This technique is beneficial to the narrow border design of the display device. In addition, the cost may be reduced such that the GOA technology has been widely applied and studied.

IGZO thin film transistors (TFTs) have high mobility and good stability. The GOA technology and the advantages of IGZO TFTs contributes to the reduction of the complexity of the GOA circuit. Due to the high mobility of IGZO TFTs, the dimension of the IGZO TFTs may be smaller than the a-Si TFTs, which contributes to the narrow border design of the display device. Also, the stabilization of the device can reduce the number of power supplies and TFTs used to stabilize the performance of TFTs. Thus, it is possible to fabricate relatively simple circuits and it is easy to reduce power consumption.

With respect to GOA circuit, a line buffer relates to a first-rising time period, which is defined as from the turn-on signals (STV) rises up until the data driver outputs the data voltage signals (Data). The longer the line buffer is, the higher the GOA circuit cost is. Thus, the cost of the display device may not be easily reduced.

SUMMARY

To overcome the above-mentioned issues, the present disclosure relates to a GOA driving circuit and a display device having the GOA driving circuit for reducing the line buffer.

In one aspect, a gate driver on array (GOA) driving circuit includes: N number of cascaded-connected GOA units, wherein N is a natural number not smaller than four, wherein the GOA unit at the i-th level includes a first transistor (T1), a second transistor (T2), a third transistor (T3), a first capacitor (C1), and a first pull-down maintain unit, wherein $1 \leq i \leq a$ and a is a natural number smaller than or equal to N/2; a source and a gate of the first transistor (T1) receives the turn-on signals (STV), and a drain of the first transistor (T1) respectively connects to the first pull-down maintain unit and the node at the i-th level Q(i); a source of the second transistor (T2) receives the turn-on signals (STV), a gate of the second transistor (T2) receives second clock signals (XCK), and a drain of the second transistor (T2) connects to the node at the i-th level Q(i); a source of the third transistor (T3) receives first clock signals (CK), a gate of the third transistor (T3) connects to the node at the i-th level Q(i), and a drain of the third transistor (T3) respectively connects to the other end of the first capacitor (C1) and the gate signal output end at the i-th level G(i); one end of the first capacitor (C1) connects to the node at the i-th level Q(i), and the other end of the first capacitor (C1) connects to the first pull-down maintain unit, the first pull-down maintain unit connects to a direct-current (DC) low voltage end (Vss); the GOA unit at the j-th level includes a fourth transistor (T4), a fifth transistor (T5), a second capacitor (C2), and a second pull-down maintain unit, wherein $a+1 \leq j \leq N$; a source of the fourth transistor (T4) connects to the gate signal output end in the (j−a)-th level G(j−a), a gate of the fourth transistor (T4) receives the second clock signals (XCK), a drain of the fourth transistor (T4) respectively connects to second pull-down maintain unit and the node at the j-th level Q(j); a source of the fifth transistor (T5) receives the first clock signals (CK), a gate of the fifth transistor (T5) connects to the node at the j-th level Q(j), and a drain of the fifth transistor (T5) respectively connects to the other end of the second capacitor (C2) and the gate signal output end at the j-th level G(j); and one end of the second capacitor (C2) connects to the node in the i-th level Q(i), and the other end of the second capacitor (C2) connects to the second pull-down maintain unit, and the second pull-down maintain unit connects to the turn-off voltage (VSS).

Wherein a waveform of the second clock signals (XCK) is opposite to the waveform of the first clock signals.

Wherein "a" equals to 4.

Wherein the second clock signals (XCK) and the first clock signals (CK) are two different clock signals in one clock signals set; the clock signals set includes M number of clock signals, wherein M is a positive integer, wherein a period of each of the clock signals is 8H, and a high level duration of each of the clock signals is 3.2H, a rising edge of the (m+1)-th clock signals is delayed by a time delay (H) of the rising edge of the m-th clock signals, wherein m is a positive integer in a range from 1 to M, and m is not equal to three, the rising edge of the third clock signals (CK4) is delayed by 1.2H of the rising edge of the second clock signals (CK3).

Wherein a high level duration of the turn-on signals (STV) is 4H, and the rising edge of the fourth clock signals (CK1) is delayed by the time delay (H) of the rising edge of the turn-on signals (STV).

Wherein a high level duration of first gate signals outputted by the gate signal output end at the first level is 4.2H, and the first rising edge of data voltage signals is delayed by 3.5H of the rising edge of the turn-on signals.

Wherein when the turn-on signals (STV) are at the high level, the first transistor (T1) is turned on, a high level of the turn-on signals (STV) is transmitted to the node at the first level Q(1), and the node at the first level Q(1) is at the high level; the third transistor (T3) is turned on, the first clock signals (CK) are at the low level, and the gate signal output end at the first level G(1) is at the low level; the first clock signals (CK) transit from the low level to the high level, the gate signal output end at the first level G(1) is at the high level, and the node at the first level Q(1) is raised up to a higher level due to a capacitance coupling effect; the second clock signals (XCK) are at the high level, the first transistor (T1) is turned on, the first clock signals (CK) are at the low level, the gate signal output end at the first level G(1) is pulled down to the low level, and the low level signals of the turn-on signals (STV) are transmitted to the node at the first level Q(1) via the turned-on first transistor (T1), and the node at the first level Q(1) is pulled down to the low level.

Wherein when the gate signal output end in the (j−a)-th level is at the high level, the second clock signals (XCK) are at the high level, the fourth transistor (T4) is turned on, the high level of the gate signal output end in the (j−a)-th level is transmitted to the node at the j-th level, and the node at the j-th level is at the high level; the fifth transistor (T5) is turned on, the first clock signals (CK) are at the low level, the gate signal output end at the j-th level is at the low level; the gate signal output end in the (j−a)-th level is at the low level, the second clock signals (XCK) are at the low level, the fourth transistor (T4) is turned off; the first clock signals (CK) are at the high level, the gate signal output end at the j-th level is at the high level, the level of the node at the j-th level is raised up to a higher level due to the capacitance coupling effect; the first clock signals (CK) are at the low level, the gate signal output end at the j-th level is pulled down to the low level, the second clock signals (XCK) are at the high level, the low level of the gate signal output end at the (j−a)-th level is transmitted to the node in the j-th level, and the node in the j-th level is pulled down to the low level.

In another aspect, a display device includes the above GOA driving circuit.

In view of the above, the GOA driving circuit may reduce the line buffer so as to reduce the cost of the GOA driving circuit.

BRIEF DESCRIPTION OF THE DRAWINGS

Embodiments of the invention will now be described more fully hereinafter with reference to the accompanying drawings, in which embodiments of the invention are shown.

FIG. 1 is a circuit diagram of the GOA unit at the i-th level in accordance with one embodiment, wherein 1≤i≤a.

DETAILED DESCRIPTION OF THE EMBODIMENTS

Figure 1:
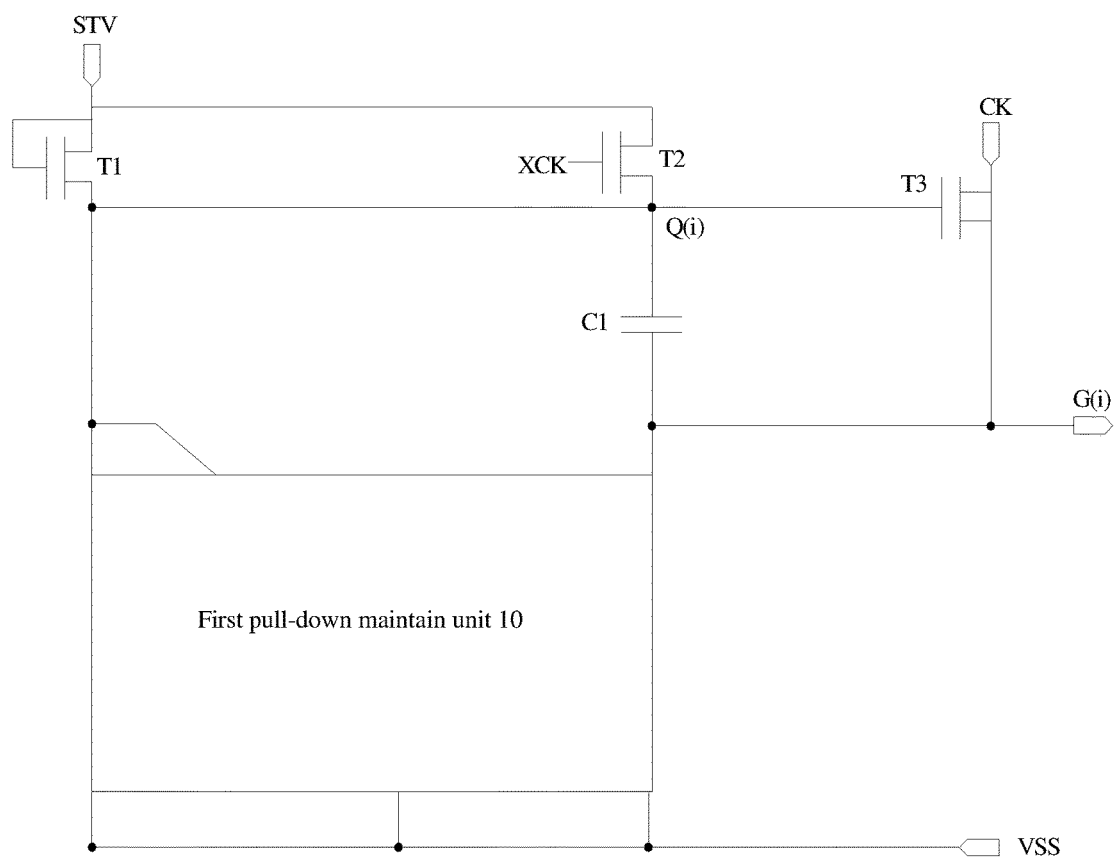

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

In one embodiment, the GOA driving circuit includes N number of cascaded-connected GOA units, that is, GOA units arranged on the first level through the N-th level. In an example, N is a natural number or a positive integer not smaller than four, but the present disclosure is not limited thereto.

FIG. 1 is a circuit diagram of the GOA unit at the i-th level in accordance with one embodiment, wherein 1≤i≤a and "a" is a natural number smaller than or equal to N/2. In one embodiment, "a" equals to four. That is, the circuit of the GOA units at the first level through the fourth level may adopt the circuit in FIG. 1.

Referring to FIG. 1, the GOA unit at the i-th level includes a first controllable transistor (T1), a second controllable transistor (T2), a third controllable transistor (T3), a first capacitor (C1), and a first pull-down maintain unit 10.

Specifically, a source and a gate of the first controllable transistor (T1) receives the turn-on signals (STV), and a drain of the first controllable transistor (T1) respectively connects to the first pull-down maintain unit 10 and the node at the i-th level Q(i); the source of the second controllable transistor (T2) receives the turn-on signals (STV), the gate of the second controllable transistor (T2) receives second clock signals (XCK), and the drain of the second controllable transistor (T2) connects to the node at the i-th level Q(i); the source of the third controllable transistor (T3) receives first clock signals (CK), the gate of the third controllable transistor (T3) connects to the node at the i-th level Q(i), and the drain of the third controllable transistor (T3) respectively connects to the other end of the first capacitor (C1) and the gate signal output end at the i-th level G(i); one end of the first capacitor (C1) connects to the node at the i-th level Q(i), the other end of the first capacitor (C1) connects to the first pull-down maintain unit 10; the first pull-down maintain unit 10 connects to the direct-current (DC) low voltage end (Vss), wherein the gate signal output end at the i-th level G(i) is configured for outputting gate signals at the i-th level.

Figure 2:
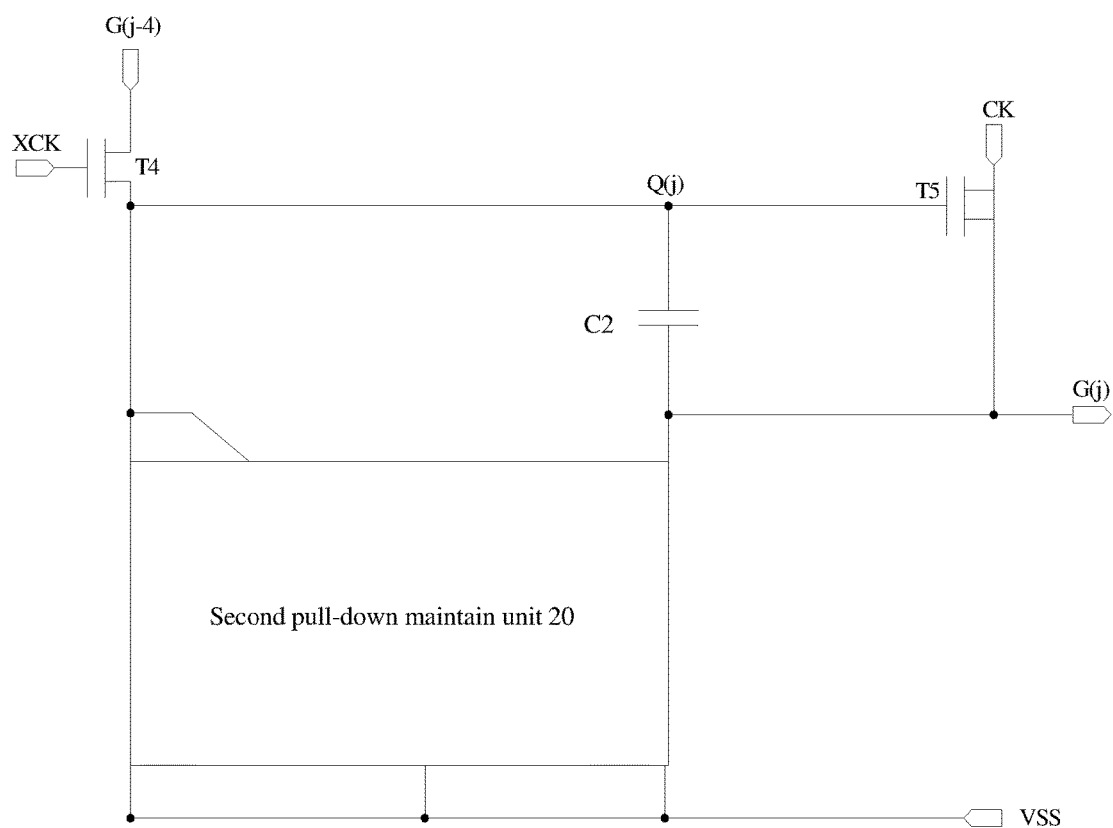
FIG. 2 is a circuit diagram of the GOA unit at the j-th level in accordance with one embodiment, wherein a+1≤j≤N.

FIG. 2 is a circuit diagram of the GOA unit at the j-th level in accordance with one embodiment, wherein a+1≤j≤N, i.e., 5≤j≤N. That is, the GOA units at the fifth level through the N-th level may adopt the circuit in FIG. 2.

Referring to FIG. 2, the GOA unit at the j-th level includes a fourth controllable transistor (T4), a fifth controllable transistor (T5), a second capacitor (C2), and a second pull-down maintain unit 20.

Specifically, a source of the fourth controllable transistor (T4) connects to the gate signal output end in the (j−4)-th level G(j−4), a gate of the fourth controllable transistor (T4) receives the second clock signals (XCK), a drain of the fourth controllable transistor (T4) respectively connects to second pull-down maintain unit 20 and the node at the j-th level Q(j); a source of the fifth controllable transistor (T5) receives the first clock signals (CK), a gate of the fifth controllable transistor (T5) connects to the node at the j-th level Q(j), and a drain of the fifth controllable transistor (T5) respectively connects to the other end of the second capacitor (C2) and the gate signal output end at the j-th level G(j); one end of the second capacitor (C2) connects to the node in the i-th level Q(i), the other end of the second capacitor (C2) connects to the second pull-down maintain unit 20; and the second pull-down maintain unit 20 connects to the turn-off voltage (VSS), wherein the gate signal output end at the j-th level G(j) outputs the gate signals at the j-th level.

In FIGS. 1 and 2, the DC low voltage end (Vss) provides a DC low voltage.

In the embodiment, the waveform of the second clock signals (XCK) is opposite to the waveform of the first clock signals (CK). In addition, the second clock signals (XCK) and the first clock signals (CK) are two different clock signals in one clock signals set.

Figure 3:
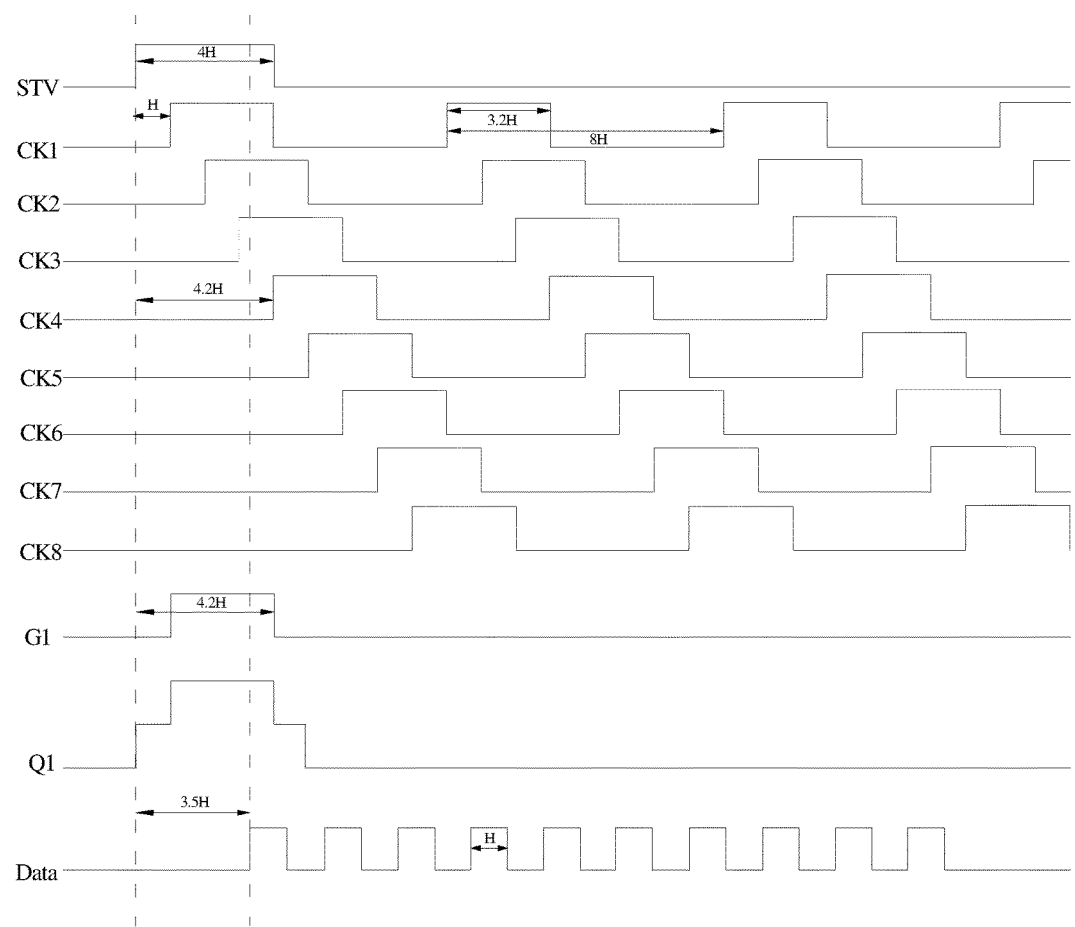
FIG. 3 is a timing diagram of the signals in accordance with one embodiment.

FIG. 3 is a timing diagram of the signals in accordance with one embodiment.

The clock signals set includes M number of clock signals, wherein M is a positive integer. In one example, preferably, M is eight, but the present disclosure is not limited thereto. That is, the clock signals set includes, the first clock signals (CK1), the second clock signals (CK2), the third clock signals (CK3), the fourth clock signals (CK4), the fifth clock signals (CK5), the sixth clock signals (CK6), the seventh clock signals (CK7), and the eighth clock signals (CK8), wherein a period of each of the clock signals is 8H, and a high level duration of each of the clock signals is 3.2H, but the present disclosure is not limited thereto.

In addition, a rising edge of the (m+1)-th clock signals is delayed by a time delay (H) of the rising edge of the m-th clock signals, wherein m is a positive integer in a range from 1 to M, and m is not equal to three. The rising edge of the third clock signals (CK4) is delayed by 1.2H of the rising edge of the second clock signals (CK3).

The high level duration of the turn-on signals (STV) is 4H, and the rising edge of the fourth clock signals (CK1) is delayed by the time delay (H) of the rising edge of the turn-on signals (STV).

Figure 4:
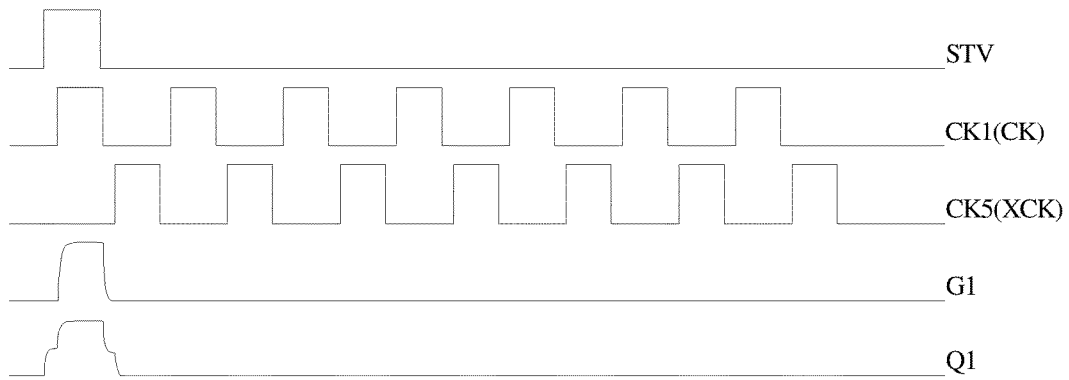
FIG. 4 is a timing diagram showing the signals when the GOA unit at the first level is in its operation in accordance with one embodiment.

The operations of the GOA unit at the first level will be described, and the GOA units at other levels may operate in a similar way. FIG. 4 is a timing diagram showing the signals when the GOA unit at the first level is in its operation in accordance with one embodiment.

Referring to FIGS. 1, 3, and 4, with respect to the GOA unit at the first level, i.e., i=1, the source and the gate of the first controllable transistor (T1) receives the turn-on signals (STV), the first clock signals (CK) are the first clock signals (CK1), and the second clock signals (XCK) are the fifth clock signals (CK5).

When the turn-on signals (STV) are at the high level, the first controllable transistor (T1) is turned on, a high level of the turn-on signals (STV) is transmitted to the node at the first level Q(1), and the node at the first level Q(1) is at the high level; the third controllable transistor (T3) is turned on, the first clock signals (CK) are at the low level, and the gate signal output end at the first level G(1) is at the low level; afterward, the first clock signals (CK) transit from the low level to the high level, the gate signal output end at the first level G(1) is at the high level, and the node at the first level Q(1) is raised up to a higher level due to the capacitance coupling effect; the second clock signals (XCK) are at the high level, the first controllable transistor (T1) is turned on, the first clock signals (CK) are at the low level, the gate signal output end at the first level G(1) is pulled down to the low level, and the low level signals of the turn-on signals (STV) are transmitted to the node at the first level Q(1) via the turned-on first controllable transistor (T1), and the node at the first level Q(1) is pulled down to the low level. In view of FIG. 3, the first rising edge of the data voltage signals (Data) is delayed by 3.5H of the rising edge of the turn-on signals (STV). That is, the line buffer is only 3.5H, which is greatly reduced and the cost may be reduced.

Figure 5:
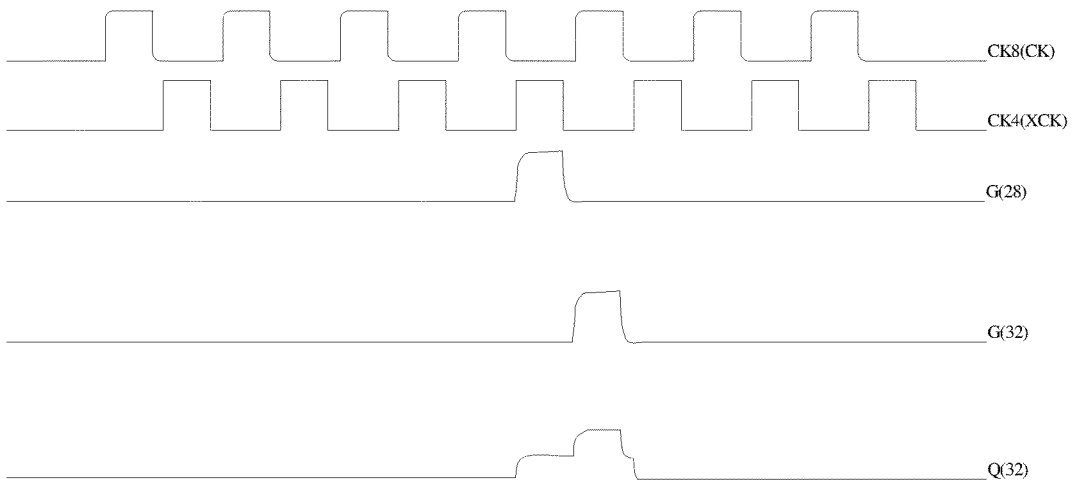
FIG. 5 is a timing diagram showing the signals when the GOA unit at the 32-th level is in its operation in accordance with one embodiment.

The operations of the GOA unit at the 32-th level will be described, and the GOA units at other levels, such as the fifth level, the 31-th level, the 32-th level, . . . , N-th level, may operate in a similar way. FIG. 5 is a timing diagram showing the signals when the GOA unit at the 32-th level is in its operation in accordance with one embodiment.

Referring to FIGS. 3 and 5, with respect to the GOA unit at the 32-th level, j=32. The source of the fourth controllable transistor (T4) connects to the gate signal output end in the 28-th level G(28), the first clock signals (CK) are the eighth clock signals (CK8), and the second clock signals (XCK) are the fourth clock signals (CK4).

When the gate signal output end in the 28-th level G(28) is at the high level, the second clock signals (XCK) are at the high level, the fourth controllable transistor (T4) is turned on, the high level of the gate signal output end in the 28-th level G(28) is transmitted to the node in the 32-th level Q(32), and the node in the 32-th level Q(32) is at the high level; at the same time, the fifth controllable transistor (T5) is turned on, the first clock signals (CK) are at the low level, the gate signal output end in the 32-th level G(32) is at the low level; gate signal output end in the 28-th level G(28) is at the low level, the second clock signals (XCK) are at the low level, the fourth controllable transistor (T4) is turned off; the first clock signals (CK) are at the high level, the gate signal output end in the 32-th level G(32) is at the high level, the level of the node in the 32-th level Q(32) is raised up to a higher level due to capacitance coupling effect; the first clock signals (CK) are at the low level, the gate signal output end in the 32-th level G(32) is pulled down to the low level, the second clock signals (XCK) are at the high level, the low level of the gate signal output end in the 28-th level G(28) is transmitted to the node in the 32-th level Q(32), and the node in the 32-th level Q(32) is pulled down to the low level.

It is to be noted that, in the embodiment, the first pull-down maintain unit 10 and the second pull-down maintain unit 20 is formed by the first pull-down maintain unit (not shown) and the second pull-down maintain unit (not shown) in a mirror connection. The first pull-down maintain unit and the second pull-down maintain unit operate in an interleaved manner to keep the node in the i-th level Q(i), the node at the j-th level Q(j), the gate signal output end in the i-th level G(i), and the gate signal output end in the (j−4)-th level G(j−4) to remain at the low level.

In view of the above, the GOA driving circuit may reduce the line buffer so as to reduce the cost of the GOA driving circuit.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driver on array (GOA) driving circuit, comprising:

N number of cascaded-connected GOA units, wherein N is a natural number not smaller than four, wherein the GOA unit at the i-th level comprises a first transistor, a second transistor; a third transistor, a first capacitor, and a first pull-down maintain unit, wherein 1≤i≤a and a is a natural number smaller than or equal to N/2;

a source and a gate of the first transistor receives turn-on signals, and a drain of the first transistor respectively connects to the first pull-down maintain unit and a node at the i-th level;

a source of the second transistor receives the turn-on signals, a gate of the second transistor receives second clock signals, and a drain of the second transistor connects to the node at the i-th level;

a source of the third transistor receives first clock signals, a gate of the third transistor connects to the node at the i-th level, and a drain of the third transistor respectively connects to the other end of the first capacitor and a gate signal output end at the i-th level;

one end of the first capacitor connects to the node at the i-th level, and the other end of the first capacitor connects to the first pull-down maintain unit, the first pull-down maintain unit connects to a direct-current low voltage end;

the GOA unit at the j-th level comprises a fourth transistor, a fifth transistor, a second capacitor, and a second pull-down maintain unit, wherein a+1≤j≤N;

a source of the fourth transistor connects to a gate signal output end in the (j−a)-th level, a gate of the fourth transistor receives the second clock signals, a drain of the fourth transistor respectively connects to second pull-down maintain unit and the node at the j-th level Q(j); a source of the fifth transistor receives the first clock signals, a gate of the fifth transistor connects to the node at the j-th level Q(j), and a drain of the fifth transistor respectively connects to the other end of the second capacitor and the gate signal output end at the j-th level; and one end of the second capacitor connects to the node in the j-th level, and the other end of the second capacitor connects to the second pull-down maintain unit, and the second pull-down maintain unit connects to a turn-off voltage; and wherein the second clock signals and the first clock signals are two different clock signals in one clock signals set;

the clock signals set comprises M number of clock signals, wherein M is a positive integer, wherein a period of each of the clock signals is 8H, and a high level duration of each of the clock signals is 3.2H, a rising edge of the (m+1)-th clock signals is delayed by a time delay of the rising edge of the m-th clock signals, wherein m is a positive integer in a range from 1 to M, and m is not equal to three, the rising edge of the third clock signals is delayed by 1.2H of the rising edge of the second clock signals.

2. The GOA driving circuit as claimed in claim 1, wherein a waveform of the second clock signals is opposite to the waveform of the first clock signals.

3. The GOA driving circuit as claimed in claim 2, wherein "a" equals to 4.

4. The GOA driving circuit as claimed in claim 2, wherein the second clock signals and the first clock signals are two different clock signals in one clock signals set;

the clock signals set comprises M number of clock signals, wherein M is a positive integer, wherein a period of each of the clock signals is 8H, and a high level duration of each of the clock signals is 3.2H, a rising edge of the (m+1)-th clock signals is delayed by a time delay of the rising edge of the m-th clock signals, wherein m is a positive integer in a range from 1 to M, and m is not equal to three, the rising edge of the third clock signals is delayed by 1.2H of the rising edge of the second clock signals.

5. The GOA driving circuit as claimed in claim 4, wherein a high level duration of the turn-on signals is 4H, and the rising edge of the fourth clock signals is delayed by the time delay of the rising edge of the turn-on signals.

6. The GOA driving circuit as claimed in claim 5, wherein a high level duration of first gate signals outputted by the gate signal output end at the first level is 4.2H, and the first rising edge of data voltage signals is delayed by 3.5H of the rising edge of the turn-on signals.

7. The GOA driving circuit as claimed in claim 6, wherein when the turn-on signals are at the high level, the first transistor is turned on, a high level of the turn-on signals is transmitted to the node at the first level, and the node at the first level is at the high level; the third transistor is turned on, the first clock signals are at the low level, and the gate signal output end at the first level is at the low level; the first clock signals transit from the low level to the high level, the gate signal output end at the first level is at the high level, and the node at the first level is raised up to a higher level due to a capacitance coupling effect; the second clock signals are at the high level, the first transistor is turned on, the first clock signals are at the low level, the gate signal output end at the first level is pulled down to the low level, and the low level signals of the turn-on signals are transmitted to the node at the first level via the turned-on first transistor, and the node at the first level is pulled down to the low level.

8. The GOA driving circuit as claimed in claim 6, wherein when the gate signal output end in the (j−a)-th level is at the high level, the second clock signals are at the high level, the fourth transistor is turned on, the high level of the gate signal output end in the (j−a)-th level is transmitted to the node at the j-th level, and the node at the j-th level is at the high level;

the fifth transistor is turned on, the first clock signals are at the low level, the gate signal output end at the j-th level is at the low level; the gate signal output end in the (j−a)-th level is at the low level, the second clock signals are at the low level, the fourth transistor is turned off;

the first clock signals are at the high level, the gate signal output end at the j-th level is at the high level, the level of the node at the j-th level is raised up to a higher level due to the capacitance coupling effect;

the first clock signals are at the low level, the gate signal output end at the j-th level is pulled down to the low level, the second clock signals are at the high level, the low level of the gate signal output end at the (j−a)-th level is transmitted to the node in the j-th level, and the node in the j-th level is pulled down to the low level.

9. The GOA driving circuit as claimed in claim 1, wherein "a" equals to 4.

10. The GOA driving circuit as claimed in claim 1, wherein a high level duration of the turn-on signals is 4H, and the rising edge of the fourth clock signals is delayed by the time delay of the rising edge of the turn-on signals.

11. The GOA driving circuit as claimed in claim 10, wherein a high level duration of first gate signals outputted by the gate signal output end at the first level is 4.2H, and the first rising edge of data voltage signals is delayed by 3.5H of the rising edge of the turn-on signals.

12. The GOA driving circuit as claimed in claim 11, wherein when the turn-on signals are at the high level, the first transistor is turned on, a high level of the turn-on signals is transmitted to the node at the first level, and the node at the first level is at the high level; the third transistor is turned on, the first clock signals are at the low level, and the gate signal output end at the first level is at the low level; the first clock signals transit from the low level to the high level, the gate signal output end at the first level is at the high level, and the node at the first level is raised up to a higher level due to a capacitance coupling effect; the second clock signals are at the high level, the first transistor is turned on, the first clock signals are at the low level, the gate signal output end at the first level is pulled down to the low level, and the low level signals of the turn-on signals are transmitted to the node at the first level via the turned-on first transistor, and the node at the first level is pulled down to the low level.

13. The GOA driving circuit as claimed in claim 11, wherein when the gate signal output end in the (j−a)-th level is at the high level, the second clock signals are at the high level, the fourth transistor is turned on, the high level of the gate signal output end in the (j−a)-th level is transmitted to the node at the j-th level, and the node at the j-th level is at the high level;

the fifth transistor is turned on, the first clock signals are at the low level, the gate signal output end at the j-th level is at the low level; the gate signal output end in the (j−a)-th level is at the low level, the second clock signals are at the low level, the fourth transistor is turned off;

the first clock signals are at the high level, the gate signal output end at the j-th level is at the high level, the level of the node at the j-th level is raised up to a higher level due to the capacitance coupling effect;

the first clock signals are at the low level, the gate signal output end at the j-th level is pulled down to the low level, the second clock signals are at the high level, the low level of the gate signal output end at the (j–a)-th level is transmitted to the node in the j-th level, and the node in the j-th level is pulled down to the low level.

14. A display device comprises the GOA driving circuit as claimed in claim 1.

* * * * *